(12) United States Patent
Wilson et al.

(10) Patent No.: US 11,350,490 B2
(45) Date of Patent: May 31, 2022

(54) INTEGRATED TEMPERATURE CONTROL FOR MULTI-LAYER CERAMICS AND METHOD

(71) Applicant: Raytheon Company, Waltham, MA (US)

(72) Inventors: James S. Wilson, Hurst, TX (US); Joshua Lamb, Garland, TX (US); Steven P. McFarlane, McKinney, TX (US)

(73) Assignee: Raytheon Company, Waltham, MA (US)

( * ) Notice: Subject to any disclaimer, the term of this patent is extended or adjusted under 35 U.S.C. 154(b) by 904 days.

(21) Appl. No.: 15/453,269

(22) Filed: Mar. 8, 2017

(65) Prior Publication Data

US 2018/0263079 A1 Sep. 13, 2018

(51) Int. Cl.
| | |
|---|---|
| *H05B 1/02* | (2006.01) |
| *H05K 7/20* | (2006.01) |
| *H05B 3/14* | (2006.01) |
| *H05B 3/22* | (2006.01) |
| *H01L 21/48* | (2006.01) |
| *G06F 1/20* | (2006.01) |
| *G05D 23/19* | (2006.01) |
| *H01L 23/34* | (2006.01) |

(52) U.S. Cl.
CPC ............... *H05B 1/02* (2013.01); *G05D 23/19* (2013.01); *G06F 1/206* (2013.01); *H01L 21/4857* (2013.01); *H01L 23/34* (2013.01); *H05B 3/141* (2013.01); *H05B 3/22* (2013.01); *H05K 7/20* (2013.01)

(58) Field of Classification Search
CPC .......... H05B 1/02; H05B 1/0202; H05B 3/22; H05B 3/26; H05B 3/265; H05B 3/141
USPC .................. 219/490, 491, 492, 494
See application file for complete search history.

(56) References Cited

U.S. PATENT DOCUMENTS

| | | | | |
|---|---|---|---|---|
| 4,007,368 | A | * 2/1977 | Jensen | .................. A61C 13/20 219/388 |
| 4,903,106 | A | * 2/1990 | Fukunaga | ........... H01L 27/0211 257/378 |
| 5,539,186 | A | * 7/1996 | Abrami | ................... H01L 23/34 174/262 |
| 5,896,259 | A | 4/1999 | Farwell et al. | |

(Continued)

FOREIGN PATENT DOCUMENTS

| | | |
|---|---|---|
| CN | 101341366 A | 1/2009 |
| CN | 102084481 B | 6/2011 |

(Continued)

OTHER PUBLICATIONS

Innovacera, "Products: Alumina Ceramic Heater", downloaded from https://www.innovacera.com/alumina-ceramic-heater, 2012-2017, 6 pages.

(Continued)

*Primary Examiner* — Helena Kosanovic
*Assistant Examiner* — Ayub A Maye

(57) ABSTRACT

A multi-layer ceramic module is provided that includes an integrated temperature control and a power switch. The integrated temperature control is configured to dissipate thermal energy. The power switch is configured to couple a power source for a standard component of the multi-layer ceramic module to the integrated temperature control.

26 Claims, 4 Drawing Sheets

(56) References Cited

U.S. PATENT DOCUMENTS

| | | | |
|---|---|---|---|
| 7,523,617 | B2 | 4/2009 | Venkatasubramanian et al. |
| 8,081,468 | B2 | 12/2011 | Hill et al. |
| 8,193,475 | B2* | 6/2012 | Yeung .................... H05B 3/265 |
| | | | 219/494 |
| 8,570,748 | B2 | 10/2013 | Lupp et al. |
| 8,620,502 | B2 | 12/2013 | Allen |
| 8,651,172 | B2 | 2/2014 | Wyatt et al. |
| 8,981,259 | B2* | 3/2015 | Chou ...................... H05B 3/26 |
| | | | 219/209 |
| 9,279,599 | B2* | 3/2016 | Lee ....................... F24H 3/0405 |
| 9,693,446 | B2* | 6/2017 | Ragg .................... H05K 1/0212 |
| 9,915,446 | B2 | 3/2018 | Malic et al. |
| 2001/0014373 | A1 | 8/2001 | Lin et al. |
| 2006/0032844 | A1 | 2/2006 | Kingrey |
| 2010/0154819 | A1 | 6/2010 | Doglioni Majer |
| 2012/0201008 | A1* | 8/2012 | Hershberger .......... H05K 7/205 |
| | | | 361/720 |
| 2013/0180973 | A1 | 7/2013 | White |
| 2014/0027435 | A1 | 1/2014 | Chou |
| 2014/0151014 | A1 | 6/2014 | Zhang |
| 2014/0154819 | A1* | 6/2014 | Gaff ................. H01L 21/67109 |
| | | | 438/17 |
| 2015/0048073 | A1 | 2/2015 | Chiu et al. |
| 2015/0118391 | A1 | 4/2015 | Kilhenny |
| 2016/0113146 | A1 | 4/2016 | Rowe |
| 2018/0070436 | A1 | 3/2018 | Feichtinger et al. |

FOREIGN PATENT DOCUMENTS

| | | |
|---|---|---|
| CN | 105593616 A | 5/2016 |
| CN | 105706231 A | 6/2016 |
| JP | 3994380 B2 | 10/2007 |
| KR | 10-2014-0145111 A | 12/2014 |
| TW | I435042 B | 4/2014 |
| TW | I489597 B | 6/2015 |
| TW | 201644019 A | 12/2016 |
| WO | 9830075 A2 | 7/1998 |

OTHER PUBLICATIONS

International Search Report and Written Opinion of the International Searching Authority from counterpart PCT Patent Application No. PCT/US2017/068207 dated Apr. 3, 2018, 13 pages.
Office Action dated May 21, 2020 in connection with counterpart Korean Patent Application No. 10-2019-7026175, 16 pages.
Office Action dated Sep. 28, 2020 in connection with counterpart Chinese Patent Application No. 201780088035.7, 20 pages.
Communication pursuant to Article 94(3) EPC dated Oct. 7, 2020 in connection with counterpart European Patent Application No. 17 832 664.1, 5 pages.
Grant of Patent dated Nov. 30, 2020 in connection with counterpart Korean Patent Application No. 10-2019-7026175, 4 pages.
Office Action dated Dec. 29, 2020 in connection with counterpart Taiwanese Patent Application No. 107100038, 17 pages.
Office Action dated Jun. 3, 2021 in connection with Chinese Patent Application No. 201780088035.7, 13 pages.
Communication pursuant to Article 94(3) EPC dated Oct. 12, 2021 in connection with European Patent Application No. 17 832 664.1, 4 pages.
Office Action dated Dec. 17, 2021 in connection with Chinese Patent Application No. 201780088035.7, 11 pages.

* cited by examiner

INTEGRATED TEMPERATURE CONTROL FOR MULTI-LAYER CERAMICS AND METHOD

GOVERNMENT RIGHTS

This invention was made with U.S. government support under contract number N00019-16-C-0002 awarded by the Navy. The U.S. government may have certain rights in this invention.

TECHNICAL FIELD

This disclosure is directed, in general, to multi-layer ceramics and, more specifically, to an integrated temperature control for multi-layer ceramics and method.

BACKGROUND

Multi-layer ceramics are useful in a wide variety of systems. In many of these systems, the electronics contained within multi-layer ceramic modules require temperatures to be maintained within limits. As a result, heaters are added to systems to mitigate cold conditions. For example, avionic systems containing transmit/receive modules, such as those used in airborne radars and jammers, often employ separate heaters on coolant lines to increase the coolant temperature of the system during a warm-up period. However, the use of these heaters may result in an unacceptable increase in mass for the overall system. In addition, the use of external heaters will have a relatively slow thermal response time.

For systems in which the components contained in the multi-layer ceramic modules may provide sufficient self-heating, a heater may be omitted. However, some multi-layer ceramic modules may require that the modules be heated before becoming operational. For example, transmit/receive modules in an airborne jamming pod may be prohibited from emitting radiofrequency (RF) signals during the warm-up period because any noise in the system during this period could interfere with adjacent systems on the platform.

SUMMARY

This disclosure provides an integrated temperature control for multi-layer ceramics and method.

In a first embodiment, a multi-layer ceramic module is provided that includes an integrated temperature control and a power switch. The integrated temperature control is configured to dissipate thermal energy. The power switch is configured to couple a power source for a standard component of the multi-layer ceramic module to the integrated temperature control.

In a second embodiment, a system is provided that includes a plurality of multi-layer ceramic modules and a cooling system. The multi-layer ceramic modules each include an integrated temperature control that is configured to dissipate thermal energy and a power switch that is configured to couple a power source for a standard component of the multi-layer ceramic module to the integrated temperature control. The cooling system includes a coolant that is configured to be heated by at least a portion of the thermal energy dissipated by the integrated temperature controls.

In a third embodiment, a method is provided that includes, during a warm-up period, powering on an integrated temperature control in a multi-layer ceramic module with a power source for a standard component of the multi-layer ceramic module. When a specified temperature reaches a threshold temperature, the integrated temperature control is powered off.

In a fourth embodiment, a method is provided that includes, when a specified temperature is below a threshold temperature, powering on an integrated temperature control in a multi-layer ceramic module with a power source for a standard component of the multi-layer ceramic module. When the specified temperature is at or above the threshold temperature, the integrated temperature control is powered off.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1A through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1A:
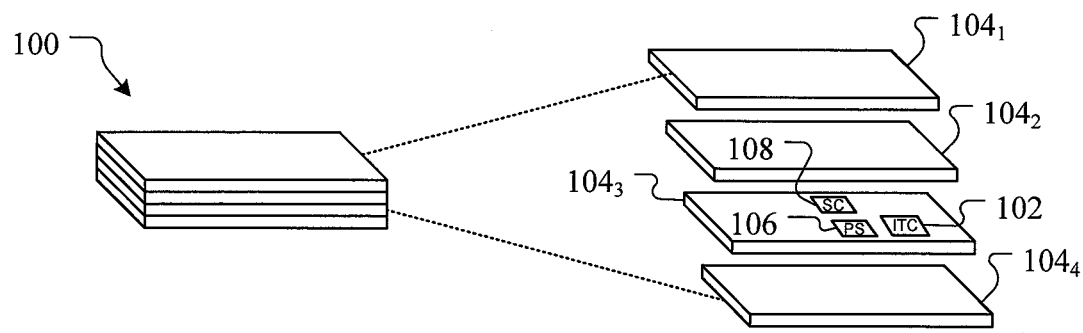
FIGS. 1A-B illustrate a multi-layer ceramic module with an integrated temperature control in accordance with embodiments of this disclosure.
Figure 1B:
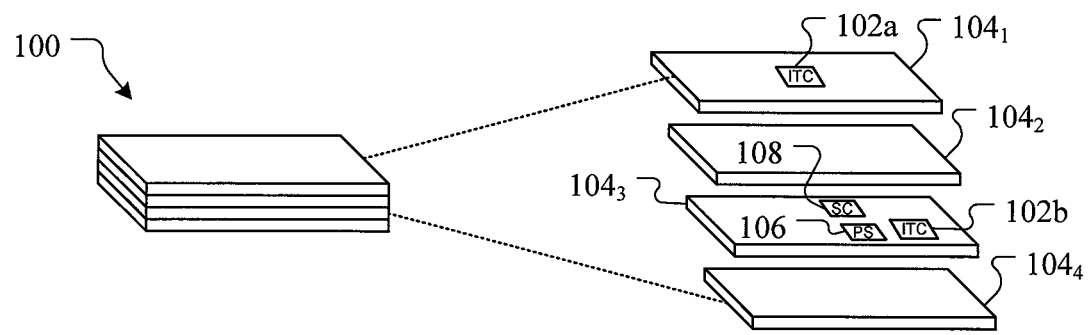

FIGS. 1A-B illustrate a multi-layer ceramic module 100 with an integrated temperature control (ITC) 102 in accordance with embodiments of this disclosure. The embodiments of the multi-layer ceramic module 100 shown in FIGS. 1A-B are for illustration only. Other embodiments of the multi-layer ceramic module 100 could be used without departing from the scope of this disclosure.

For the embodiments illustrated in FIGS. 1A-B, the multi-layer ceramic module 100 includes four layers $104_{1-4}$. However, it will be understood that the multi-layer ceramic module 100 may include any suitable number of layers depending on the purpose of the multi-layer ceramic module 100 and the manner in which it is implemented. The multi-layer ceramic module 100 may be a low temperature co-fired ceramic or a high-temperature co-fired ceramic and may be thin film or thick film.

For the particular example of FIG. 1A, the third layer $104_3$ includes the integrated temperature control 102. For the particular example of FIG. 1B, the first layer $104_1$ and the third layer $104_3$ may each include a portion of the integrated temperature control 102, i.e., the first layer $104_1$ may include a first portion of the integrated temperature control 102a and the third layer $104_3$ may include a second portion of the integrated temperature control 102b.

Although illustrated as including two portions 102a and 102b in this example, it will be understood that the number of portions of the integrated temperature control 102 may be any other suitable number. In addition, for this embodiment, the integrated temperature control 102 may function as a single unit, or alternatively, each portion of the integrated temperature control 102a and 102b may function independently. If the integrated temperature control 102 includes more than two portions, each of the portions may be configured to function independently or as a unit with any suitable number of additional portions. Also, for some embodiments, multiple portions of the integrated temperature control 102 may be included within a single one of the layers $104_{1-4}$.

For the illustrated embodiment, the third layer $104_3$ also includes a power switch (PS) 106 and a standard component (SC) 108. The power switch 106 may couple a power source (not shown in FIGS. 1A-B) for the standard component 108 to the integrated temperature control 102. During normal operation of the multi-layer ceramic module 100, for some embodiments, the power switch 106 may be configured to provide power from the power source to the standard component 108. When heating is desired, such as during a warm-up period, the power switch 106 may be configured to provide power from the power source to the integrated temperature control 102 instead of (or in addition to) the standard component 108. For other embodiments, a separate power switch may be used to couple the power source to the standard component 108. Also, for some embodiments, the power source may be external to the multi-layer ceramic module 100.

For the embodiment illustrated in FIG. 1B, the first portion of the integrated temperature control 102a in the first layer $104_1$ may be coupled to the power switch 106 in the third layer $104_3$. However, it will be understood that the first portion of the integrated temperature control 102a may be coupled to a different power switch that may be coupled to either the same power source or a different power source for either the same standard component 108 or a different standard component (not shown in FIG. 1B) in any of the layers $104_{1-4}$. Similarly, for the embodiment illustrated in FIG. 1A, the integrated temperature control 102, the power switch 106 and the standard component 108 may each be located in any of the layers $104_{1-4}$ and need not be located in the same layer 104 as each other.

The integrated temperature control 102 may include one or more resistors in a resistive network that is configured to dissipate thermal energy when the integrated temperature control 102 is powered on. For example, for a particular embodiment in which the multi-layer ceramic module 100 is a transmit/receive module for an airborne jamming pod system, the resistive network of the integrated temperature control 102 may be configured with resistance that may dissipate about 85 to 120 W. In addition, for this particular embodiment, the power switch 106 may be coupled to a drain voltage supply for a power source, and the standard component 108 may correspond to a high-powered amplifier (HPA). For this particular embodiment, the integrated temperature control 102 may be powered on by using the power switch 106 to route current from the HPA drain voltage supply through the integrated temperature control 102 instead of (or in addition to) the HPA.

The integrated temperature control 102 may be located in any suitable location within the multi-layer ceramic module 100. For example, the integrated temperature control 102 may be included in any portion of one or more of the layers $104_{1-4}$ in which space is available. For some embodiments, the integrated temperature control 102 may be located strategically to optimize transfer of the thermal energy to a coolant within a cooling system for a system that includes the multi-layer ceramic module 100, as described below in connection with FIG. 2. For a particular embodiment in which the multi-layer ceramic module 100 is a transmit/receive module for an airborne jamming pod system, the integrated temperature control 102 may be located near the base of the module 100.

In this way, temperature control may be integrated into the multi-layer ceramic module 100. As a result, a separate heater is not required, thereby allowing the mass of the system in which the module 100 is implemented to be minimized. In addition, the integrated temperature control 102 allows the multi-layer ceramic module 100 to have temperature control in situations where self-heating is not an option, e.g., due to RF restrictions. Also, the use of an integrated temperature control 102 results in a faster thermal response time as compared with the use of an external heater.

Although FIG. 1A and FIG. 1B each illustrate one example of a multi-layer ceramic module 100, various changes may be made to the embodiments of FIGS. 1A-B. For example, various components of the multi-layer ceramic module 100 could be combined, further subdivided, moved, or omitted and additional components could be added according to particular needs.

Figure 2:
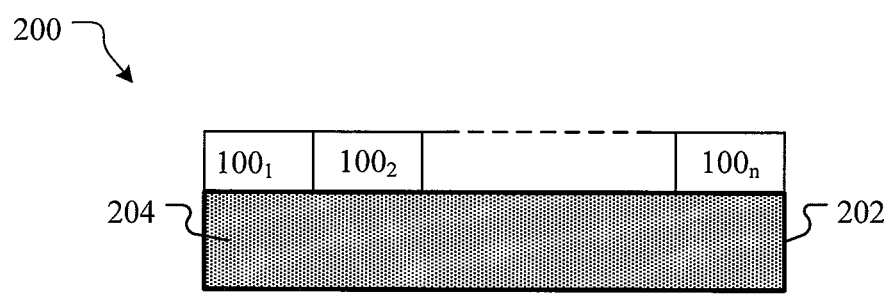
FIG. 2 illustrates a portion of a system including multiple multi-layer ceramic modules in accordance with an embodiment of this disclosure.

FIG. 2 illustrates a portion of a system 200 that includes multiple multi-layer ceramic modules $100_{1-n}$ in accordance with an embodiment of this disclosure. The embodiment of the system 200 shown in FIG. 2 is for illustration only. Other embodiments of the system 200 could be used without departing from the scope of this disclosure. Each of the multi-layer ceramic modules $100_{1-n}$ may correspond to the multi-layer ceramic module 100 of FIG. 1A or 1B.

For the illustrated embodiment, the system 200 includes a cooling system 202 through which a coolant 204 may flow. The cooling system 202 is configured to alter the temperature of the system 200 by passing the coolant 204 throughout the system 200 to exchange thermal energy with the system 200.

A plurality of multi-layer ceramic modules $100_{1-n}$ may be coupled to the cooling system 202 to assist each other in controlling the temperature of the coolant 204. Thus, for example, the total heat for bringing the system 200 to a desired level may be divided among multiple multi-layer ceramic modules $100_{1-n}$, allowing each module 100 to dissipate a more manageable amount of power. The lower power dissipation for each module 100 allows the component size and mass to be minimized. In this way, the multi-layer ceramic modules $100_{1-n}$ may be used to warm up, and/or provide thermal regulation for, the entire system 200, including other electronics (not shown in FIG. 2) that are downstream from the coolant 204.

The multi-layer ceramic modules $100_{1-4}$ may be coupled to the cooling system 202 in any suitable manner. For example, the multi-layer ceramic modules $100_{1-n}$ may be coupled in strategic locations along one or more sides of the cooling system 202 or may be coupled around the entire perimeter of the cooling system 202. In addition, although shown as adjacent to each other, it will be understood that the multi-layer ceramic modules $100_{1-n}$ may be placed in any suitable locations relative to each other around the cooling system 202. The multi-layer ceramic modules $100_{1-n}$ may be the same as each other or any suitable combination of module types. For example, for some embodiments, the multi-layer ceramic modules $100_{1-n}$ may all be transmit/receive modules or all some other specific type of module. For other embodiments, the multi-layer ceramic modules $100_{1-n}$ may be a combination of different types of modules.

At the system level, the amount of prime power and dissipated heat can be varied by controlling the number of integrated temperature controls 102 enabled in the modules $100_{1-n}$. For example, the integrated temperature controls 102 of a subset of multi-layer ceramic modules 100 in the system 200 may be powered on, while the remaining integrated temperature controls 102 are powered off. As described above in connection with FIGS. 1A-B, the integrated temperature controls 102 may be configured to utilize the same power supplies and power distribution as are used for normal operation of the multi-layer ceramic modules $100_{1-n}$, which further minimizes impact to the system design and mass. For a particular embodiment in which the multi-layer ceramic modules $100_1$, are transmit/receive modules for an airborne jamming pod system 200, the integrated temperature controls 102 may be configured to utilize the same power supplies and power distribution as are used for normal RF operation of the HPAs of the modules $100_{1-n}$.

Figure 3:
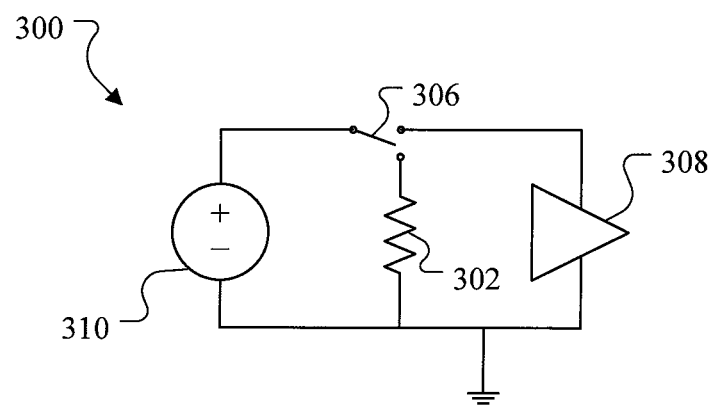
FIG. 3 illustrates a circuit diagram of a portion of a multi-layer ceramic module with an integrated temperature control in accordance with an embodiment of this disclosure.

FIG. 3 illustrates a circuit diagram of a portion of a multi-layer ceramic module 300 with an integrated temperature control 302 in accordance with an embodiment of this disclosure. The embodiment of the multi-layer ceramic module 300 shown in FIG. 3 is for illustration only. Other embodiments of the multi-layer ceramic module 300 could be used without departing from the scope of this disclosure. The multi-layer ceramic module 300 may correspond to the multi-layer ceramic module 100 of FIG. 1A or 1B.

For the example illustrated in the embodiment of FIG. 3, the multi-layer ceramic module 300 includes an integrated temperature control 302 (corresponding to the integrated temperature control 102), a power switch 306 (corresponding to the power switch 106), an amplifier 308 (corresponding to the standard component 108), and a drain voltage supply 310 as a power source. The drain voltage supply 310 is configured to provide voltage to the amplifier 308 to power on the amplifier 308. In addition, the drain voltage supply 310 is configured to provide voltage to the integrated temperature control 302 to power on the integrated temperature control 302. The power switch 306 is configured to couple the drain voltage supply 310 to either the amplifier 308 or the integrated temperature control 302.

Thus, in operation, for some embodiments, the power switch 306 couples the drain voltage supply 310 to the integrated temperature control 302 during a warm-up period for the multi-layer ceramic module 300. In this configuration, thermal energy is dissipated in the resistive network of the integrated temperature control 302 and may be used to heat at least a portion of the module 300, which may for some embodiments be used to heat a coolant (such as the coolant 204 of FIG. 2) until a desired temperature is achieved. Once the desired temperature is reached, the power switch 306 couples the drain voltage supply 310 to the amplifier 308, which operates normally as a standard component of the multi-layer ceramic module 300.

For other embodiments, the power switch 306 may be employed to couple the drain voltage supply 310 alternately to the integrated temperature control 302 and the amplifier 308 at a specified rate in order to maintain a desired temperature for the multi-layer ceramic module 300 after the warm-up period. For still other embodiments, the power switch 306 may be employed to couple the drain voltage supply 310 alternately to the integrated temperature control 302 and the amplifier 308 based on a specified temperature of the multi-layer ceramic module 300 or a particular component within the module 300 in order to maintain the desired temperature.

Although FIG. 3 illustrates one example of a multi-layer ceramic module 300, various changes may be made to the embodiment of FIG. 3. For example, various components of the multi-layer ceramic module 300 could be combined, further subdivided, moved, or omitted and additional components could be added according to particular needs.

Figure 4:
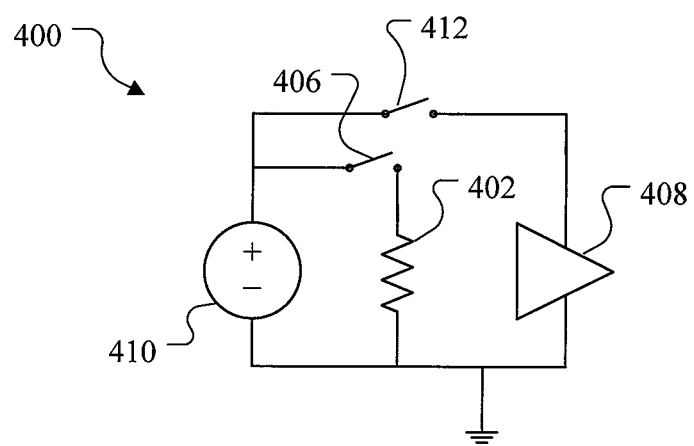
FIG. 4 illustrates a circuit diagram of a portion of a multi-layer ceramic module with an integrated temperature control in accordance with another embodiment of this disclosure.

FIG. 4 illustrates a circuit diagram of a portion of a multi-layer ceramic module 400 with an integrated temperature control 402 in accordance with another embodiment of this disclosure. The embodiment of the multi-layer ceramic module 400 shown in FIG. 4 is for illustration only. Other embodiments of the multi-layer ceramic module 400 could be used without departing from the scope of this disclosure. The multi-layer ceramic module 400 may correspond to the multi-layer ceramic module 100 of FIG. 1A or 1B.

For the example illustrated in the embodiment of FIG. 4, the multi-layer ceramic module 400 includes an integrated temperature control 402 (corresponding to the integrated temperature control 102), a first power switch 406 (corresponding to the power switch 106), an amplifier 408 (corresponding to the standard component 108), a drain voltage supply 410 as a power source, and a second power switch 412. The drain voltage supply 410 is configured to provide voltage to the integrated temperature control 402 to power on the integrated temperature control 402. In addition, the drain voltage supply 410 is configured to provide voltage to the amplifier 408 to power on the amplifier 408. The first power switch 406 is configured to couple the drain voltage supply 410 to the integrated temperature control 402, while the second power switch 412 is configured to couple the drain voltage supply 410 to the amplifier 408.

Thus, in operation, for some embodiments, during a warm-up period for the multi-layer ceramic module 400, the first power switch 406 couples the drain voltage supply 410 to the integrated temperature control 402, and the second power switch 412 decouples the drain voltage supply 410 from the amplifier 408. In this configuration, thermal energy is dissipated in the resistive network of the integrated temperature control 402 and may be used to heat at least a portion of the module 400, which may for some embodiments be used to heat a coolant (such as the coolant 204 of FIG. 2) until a desired temperature is achieved. Once the desired temperature is reached, the first power switch 406 decouples the drain voltage supply 410 from the integrated temperature control 402, and the second power switch 412 couples the drain voltage supply 410 to the amplifier 408, which operates normally as a standard component of the multi-layer ceramic module 400.

For other embodiments, the power switches 406 and 412 may be operated independently of each other such that the drain voltage supply 410 may be coupled to both the integrated temperature control 402 and the amplifier 408 simultaneously or may be decoupled from both the integrated temperature control 402 and the amplifier 408 simultaneously. In addition, for some embodiments, the first power switch 406 may be employed to couple the drain voltage supply 410 to the integrated temperature control 402 at a specified rate in order to maintain a desired temperature for the multi-layer ceramic module 400 after the warm-up period. For still other embodiments, the first power switch 406 may be employed to couple the drain voltage supply 410 to the integrated temperature control 402 based on a specified temperature of the multi-layer ceramic module 400 or a particular component within the module 400 in order to maintain the desired temperature.

Although FIG. 4 illustrates one example of a multi-layer ceramic module 400, various changes may be made to the embodiment of FIG. 4. For example, various components of the multi-layer ceramic module 400 could be combined, further subdivided, moved, or omitted and additional components could be added according to particular needs.

Figure 5:
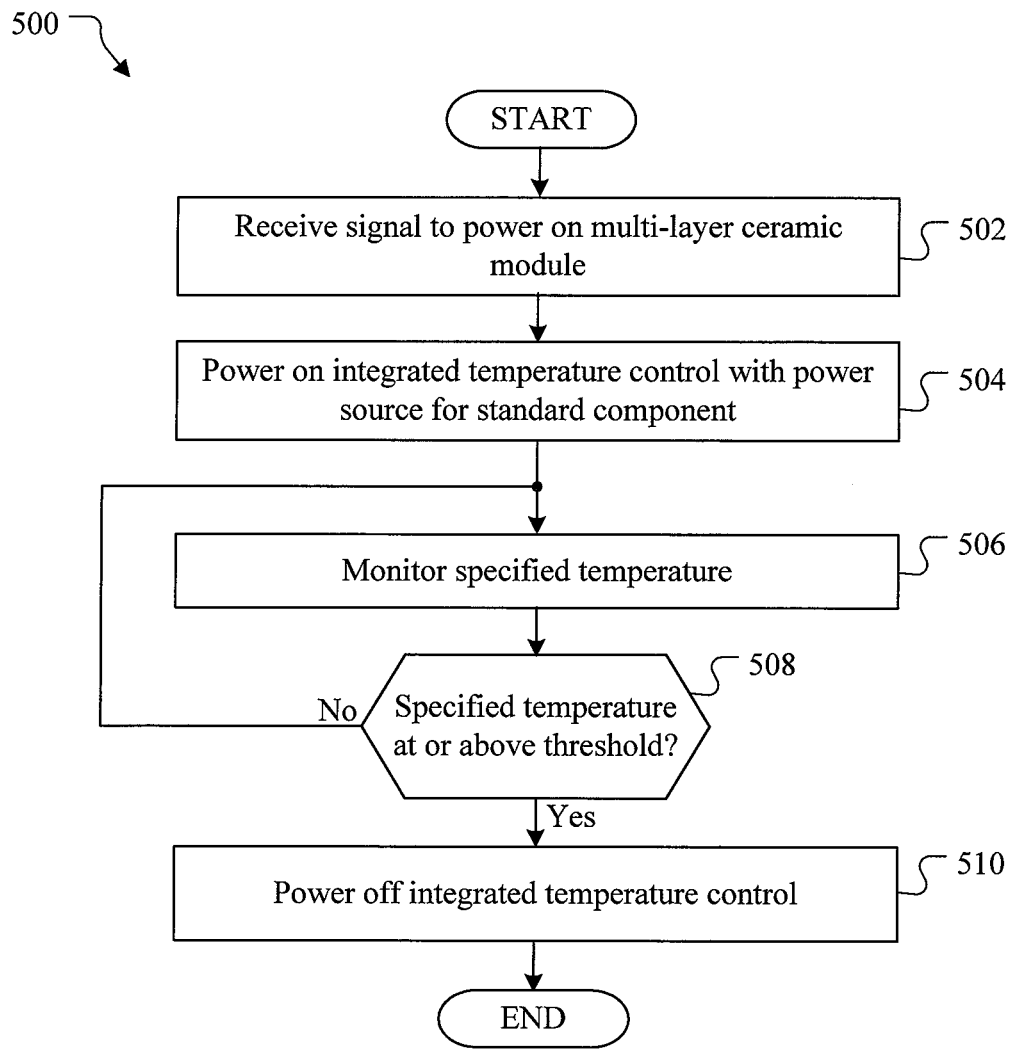
FIG. 5 illustrates a method for providing integrated temperature control for a multi-layer ceramic module in accordance with an embodiment of this disclosure.

FIG. 5 illustrates a method 500 for providing integrated temperature control for a multi-layer ceramic module 100 in accordance with an embodiment of this disclosure. The method 500 shown in FIG. 5 is for illustration only. A multi-layer ceramic module 100 may be provided with integrated temperature control in any other suitable manner without departing from the scope of this disclosure.

Initially, a signal is received to power on the multi-layer ceramic module 100 (step 502). A power source for a standard component 108 of the module 100 powers on an integrated temperature control 102 (step 504). For example, for a particular embodiment, a power switch 106 could couple the power source to the integrated temperature control 102 instead of the standard component 108. For another particular embodiment, the power switch 106 could couple the power source to the integrated temperature control 102 in addition to the standard component 108.

A specified temperature is monitored (step 506). For example, for a particular embodiment, the temperature of a coolant 204 in a cooling system 202 may be monitored. For another particular embodiment, the temperature of the multi-layer ceramic module 100 or a specified one of the components within the module 100 may be monitored. When the specified temperature has not reached a threshold temperature (step 508), the specified temperature continues to be monitored (step 506). When the specified temperature is at or above the threshold temperature (step 508), the integrated temperature control 102 is powered off (step 510). For example, for a particular embodiment, the power switch 106 could decouple the power source from the integrated temperature control 102 to power off the integrated temperature control 102 and couple the power source to the standard component 108 to power on the standard component 108. For another particular embodiment, the power switch 106 could decouple the power source from the integrated temperature control 102 to power off the integrated temperature control 102 and continue to couple the power source to the standard component 108 to continue powering the standard component 108. In this way, temperature control may be integrated into the multi-layer ceramic module 100, eliminating the need for a separate heater and thereby decreasing mass and space requirements. In addition, the multi-layer ceramic module 100 may be warmed up before becoming operational.

Although FIG. 5 illustrates one example of a method 500 for providing integrated temperature control for a multi-layer ceramic module 100, various changes may be made to the embodiment shown in FIG. 5. For example, while shown as a series of steps, various steps in FIG. 5 could overlap, occur in parallel, occur in a different order, or occur multiple times. As a specific example, the monitoring of the specified temperature in step 506 may be active or passive. For an active example, a temperature sensing component in the module 100 may be designed to actively monitor the specified temperature. For a passive example, a physical component in the module 100 may be designed to react in a particular way when that component reaches a desired temperature, signaling that the threshold temperature has been reached.

Figure 6:
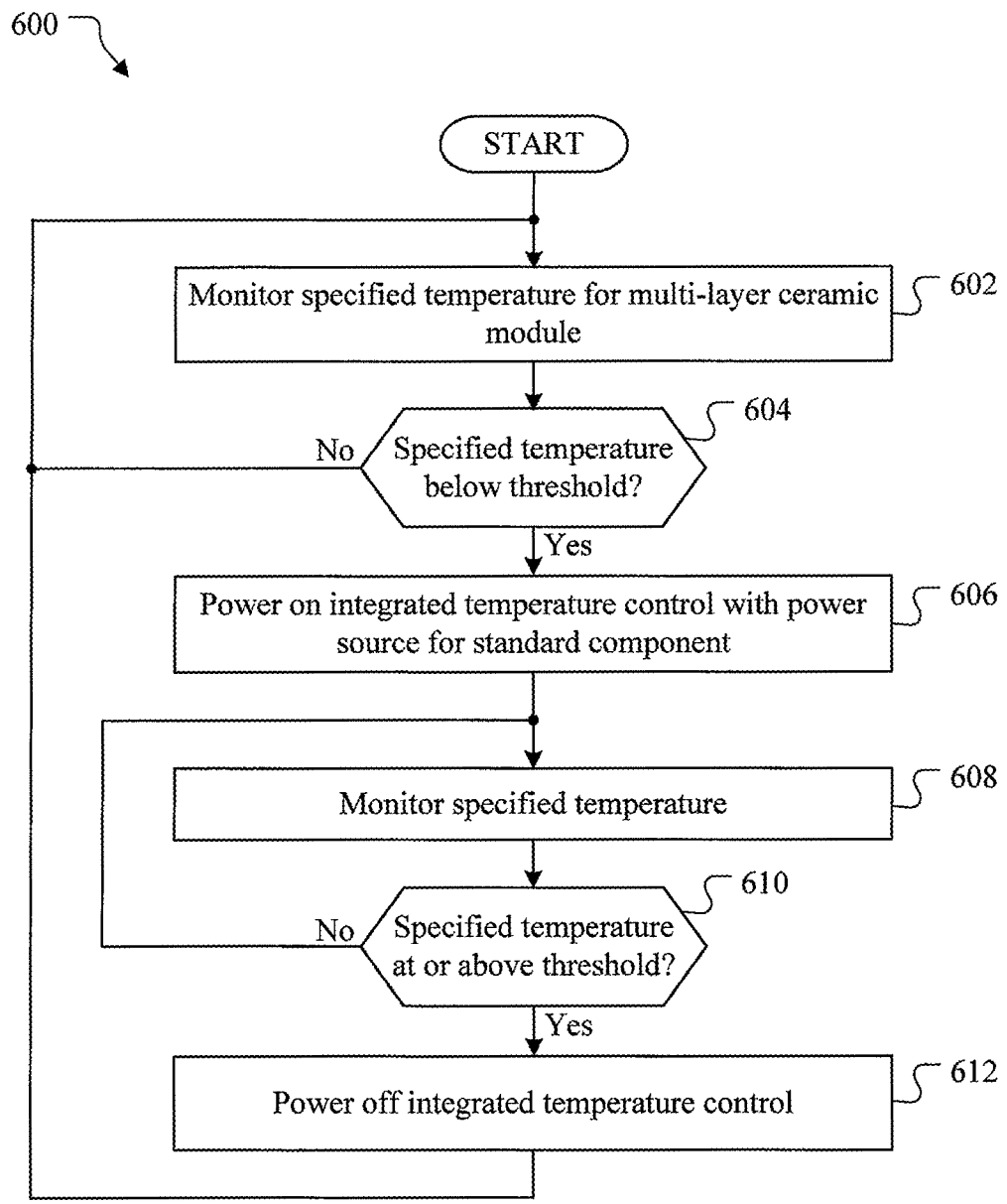
FIG. 6 illustrates a method for providing integrated temperature control for a multi-layer ceramic module in accordance with another embodiment of this disclosure.

FIG. 6 illustrates a method 600 for providing integrated temperature control for a multi-layer ceramic module 100 in accordance with another embodiment of this disclosure. The method 600 shown in FIG. 6 is for illustration only. A multi-layer ceramic module 100 may be provided with integrated temperature control in any other suitable manner without departing from the scope of this disclosure.

Initially, a specified temperature is monitored for the multi-layer ceramic module 100 (step 602). For example, for a particular embodiment, the temperature of a coolant 204 in a cooling system 202 may be monitored. For another particular embodiment, the temperature of the multi-layer ceramic module 100 or a specified one of the components within the module 100 may be monitored. When the specified temperature is not below a threshold temperature (step 604), the specified temperature continues to be monitored (step 602). When the specified temperature is below the threshold temperature (step 604), a power source for a standard component 108 of the multi-layer ceramic module 100 powers on an integrated temperature control 102 for the module 100 (step 606). For example, for a particular embodiment, a power switch 106 could couple the power source to the integrated temperature control 102 instead of the standard component 108. For another particular embodiment, the power switch 106 could couple the power source to the integrated temperature control 102 in addition to the standard component 108.

The specified temperature is monitored again (step 608). When the specified temperature has not reached a threshold temperature (step 610), the specified temperature continues to be monitored (step 608). The threshold temperature compared to the specified temperature in step 610 may be the same or a different temperature as the threshold temperature compared to the specified temperature in step 604. When the specified temperature is at or above the threshold temperature (step 610), the integrated temperature control 102 is powered off (step 612), after which the specified temperature is monitored again (step 602). For example, for a particular embodiment, the power switch 106 could decouple the power source from the integrated temperature control 102 to power off the integrated temperature control 102 and couple the power source to the standard component 108 to power on the standard component 108. For another particular embodiment, the power switch 106 could decouple the power source from the integrated temperature control 102 to power off the integrated temperature control 102 and continue to couple the power source to the standard component 108 to continue powering the standard component 108.

In this way, temperature control may be integrated into the multi-layer ceramic module 100, eliminating the need for a separate heater and thereby decreasing mass and space requirements. In addition, the integrated temperature control 102 allows any temperature-sensitive components (including the standard component 108 and/or any other suitable component) within the module 100 to be maintained at a precise temperature or within a desired temperature range after a warm-up period.

Although FIG. 6 illustrates one example of a method 600 for providing integrated temperature control for a multi-layer ceramic module 100, various changes may be made to the embodiment shown in FIG. 6. For example, while shown as a series of steps, various steps in FIG. 6 could overlap, occur in parallel, occur in a different order, or occur multiple times. As a specific example, the monitoring of the specified temperature in steps 602 and 608 may be active or passive. For an active example, a temperature sensing component in the module 100 may be designed to actively monitor the specified temperature. For a passive example, a physical component in the module 100 may be designed to react in a particular way when that component reaches a desired temperature, signaling that the threshold temperature has been reached.

Modifications, additions, or omissions may be made to the apparatuses and methods described herein without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above descriptions of various embodiments does not define or constrain this disclosure. Other changes, substitutions, and alterations are also possible without departing from the spirit and scope of this disclosure, as defined by the following claims.

What is claimed is:

1. A multi-layer ceramic module, comprising:
    an integrated temperature control embedded in a layer of the multi-layer ceramic module and configured to dissipate thermal energy; and
    a power switch embedded in the layer of the multi-layer ceramic module and configured to:
        couple a power source for a standard component of the multi-layer ceramic module to the integrated temperature control; and
        after a warm-up period, couple the power source intermittently to the integrated temperature control at a specified rate or based on a specified temperature.

2. The multi-layer ceramic module of claim 1, wherein the power switch is a mechanical switch configured to:
    couple the power source to the standard component during normal operation of the multi-layer ceramic module; and
    couple the power source to the integrated temperature control instead of the standard component during the warm-up period.

3. The multi-layer ceramic module of claim 1, wherein the power switch is configured to:
    couple the power source to the standard component during normal operation of the multi-layer ceramic module; and
    couple the power source to the integrated temperature control and the standard component during the warm-up period.

4. The multi-layer ceramic module of claim 1, wherein the power switch is configured to couple the power source continuously to the integrated temperature control during the warm-up period.

5. The multi-layer ceramic module of claim 1, wherein the power switch includes:
    a first power switch configured to couple the power source to the integrated temperature control; and
    a second power switch configured to couple the power source to the standard component.

6. The multi-layer ceramic module of claim 1, wherein different portions of the integrated temperature control reside in different layers of the multi-layer ceramic module.

7. The multi-layer ceramic module of claim 1, wherein the integrated temperature control comprises one or more resistors in a resistive network that is configured to dissipate the thermal energy when the integrated temperature control is powered on.

8. The multi-layer ceramic module of claim 1, wherein:
    the multi-layer ceramic module is a transmit/receive module for an airborne jamming pod system;
    the power switch is configured to be coupled to a drain voltage supply for the power source; and
    the standard component corresponds to a high-powered amplifier.

9. The multi-layer ceramic module of claim 1, wherein:
    the standard component corresponds to an amplifier; and
    a drain voltage supply is the power source.

10. The multi-layer ceramic module of claim 6, wherein the different portions of the integrated temperature control function independently.

11. The multi-layer ceramic module of claim 6, wherein:
    the multi-layer ceramic module comprises first, second, third, and fourth layers;
    a first portion of the integrated temperature control resides in the first layer; and
    a second portion of the integrated temperature control resides in the third layer.

12. A system, comprising:
    a plurality of multi-layer ceramic modules, each multi-layer ceramic module comprising:
        an integrated temperature control embedded in a layer of the multi-layer ceramic module and configured to dissipate thermal energy; and
        a power switch embedded in the layer of the multi-layer ceramic module and configured to:
            couple a power source for a standard component of the multi-layer ceramic module to the integrated temperature control; and
            after a warm-up period, couple the power source intermittently to the integrated temperature control at a specified rate or based on a specified temperature; and a cooling system comprising a coolant, wherein the coolant is configured to be heated by at least a portion of the thermal energy dissipated by the integrated temperature controls.

13. The system of claim 12, wherein the multi-layer ceramic modules are coupled to at least one side of the cooling system and are located adjacent to each other.

14. The system of claim 12, wherein the multi-layer ceramic modules are coupled around a perimeter of the cooling system.

15. The system of claim 12, wherein, for each of the multi-layer ceramic modules, the power switch is configured to:
couple the power source to the standard component during normal operation of the multi-layer ceramic module; and
couple the power source to the integrated temperature control instead of the standard component during the warm-up period.

16. The system of claim 12, wherein for each of the multi-layer ceramic modules, the power switch is configured to:
couple the power source to the standard component during normal operation of the multi-layer ceramic module; and
couple the power source to the integrated temperature control and the standard component during the warm-up period.

17. The system of claim 12, wherein for each of the multi-layer ceramic modules, the power switch is configured to couple the power source continuously to the integrated temperature control during the warm-up period.

18. The system of claim 12, wherein, for each of the multi-layer ceramic modules, the power switch includes:
a first power switch configured to couple the power source to the integrated temperature control; and
a second power switch configured to couple the power source to the standard component.

19. A method comprising:
during a warm-up period, powering on an integrated temperature control in a multi-layer ceramic module with a power source for a standard component of the multi-layer ceramic module;
when a temperature of the standard component reaches a threshold temperature indicating an end of the warm-up period, powering off the integrated temperature control; and
after the warm-up period, intermittently powering on the integrated temperature control at a specified rate or based on a specified temperature;
wherein the integrated temperature control is embedded in a layer of the multi-layer ceramic module and is configured to dissipate thermal energy; and
wherein a power switch is embedded in the layer of the multi-layer ceramic module and is configured to couple the power source to the integrated temperature control.

20. The method of claim 19, wherein powering on the integrated temperature control comprises coupling the power source to the integrated temperature control and decoupling the power source from the standard component.

21. The method of claim 20, wherein powering off the integrated temperature control comprises decoupling the power source from the integrated temperature control and coupling the power source to the standard component.

22. The method of claim 19, wherein powering on the integrated temperature control comprises coupling the power source to the integrated temperature control and to the standard component.

23. The method of claim 22, wherein powering off the integrated temperature control comprises decoupling the power source from the integrated temperature control.

24. A method comprising:
when a temperature of a standard component of a multi-layer ceramic module is below a threshold temperature, powering on an integrated temperature control in the multi-layer ceramic module with a power source for the standard component of the multi-layer ceramic module;
when the temperature of the standard component is at or above the threshold temperature, powering off the integrated temperature control; and
after the temperature of the standard component is at or above the threshold temperature, intermittently powering on the integrated temperature control at a specified rate or based on a specified temperature;
wherein the integrated temperature control is embedded in a layer of the multi-layer ceramic module and is configured to dissipate thermal energy; and
wherein a power switch is embedded in the layer of the multi-layer ceramic module and is configured to couple the power source to the integrated temperature control.

25. The method of claim 24, wherein:
powering on the integrated temperature control comprises coupling the power source to the integrated temperature control and decoupling the power source from the standard component; and
powering off the integrated temperature control comprises decoupling the power source from the integrated temperature control and coupling the power source to the standard component.

26. The method of claim 24, wherein:
powering on the integrated temperature control comprises coupling the power source to the integrated temperature control and to the standard component; and
powering off the integrated temperature control comprises decoupling the power source from the integrated temperature control.

* * * * *